United States Patent [19]
Tsong et al.

[11] Patent Number: 5,670,850
[45] Date of Patent: Sep. 23, 1997

[54] VIDEO CIRCUIT AND VIDEO SIGNAL PROCESSING AND CONTROL TECHNIQUES FOR CONTROLLING THE "TILT" OF A VIDEO DISPLAY THAT MAY BE IMPLEMENTED WITH LINBICMOS TECHNOLOGY

[75] Inventors: Danny Tsong, Taipei; Tony Chou; Johnson Chiang, both of Taipei Hsien, all of Taiwan

[73] Assignee: Texas Instruments Incorporated, Dallas, Tex.

[21] Appl. No.: 304,004

[22] Filed: Sep. 9, 1994

[51] Int. Cl.$^6$ ............................................. H01J 29/56
[52] U.S. Cl. ............................................... 315/370
[58] Field of Search ................................. 315/370, 371

[56] References Cited

U.S. PATENT DOCUMENTS

| | | | |
|---|---|---|---|
| 4,586,004 | 4/1986 | Valdez | 330/300 |
| 4,667,165 | 5/1987 | De Weck | 330/253 |
| 5,293,223 | 3/1994 | Kawamoto et al. | 348/655 |

*Primary Examiner*—Theodore M. Blum
*Attorney, Agent, or Firm*—Alan K. Stewart; Richard L. Donaldson; Wade James Brady, III

[57] ABSTRACT

A circuit (10) and method for reducing a tilt of a video picture on a color monitor includes a circuit (30) for providing an output signal for controlling the vertical position of the scanning beam that includes an MOS transistor (60) having substantially zero current flow in its gate element, and connected to control the magnitude of the output drive signal. In a preferred embodiment, a LinBiCMOS semiconductor manufacturing process is employed to fabricate a plurality of bipolar transistors connected to provide a control voltage on the gate of the MOS transistor (60), which may conveniently be an NMOS device. The bipolar transistors may be connected to form a translinear cell (11) connected to receive a signal (17) related to a horizontal synchronizing signal and to provide a voltage output to the gate of the MOS transistor (60) in response thereto.

6 Claims, 1 Drawing Sheet

5,670,850

VIDEO CIRCUIT AND VIDEO SIGNAL PROCESSING AND CONTROL TECHNIQUES FOR CONTROLLING THE "TILT" OF A VIDEO DISPLAY THAT MAY BE IMPLEMENTED WITH LINBICMOS TECHNOLOGY

BACKGROUND OF THE INVENTION

1. Field of the Invention

This invention relates to improvements in video circuit and video signal processing and control techniques, and more particularly to improvements in video amplifier and preamplifier circuits and signal processing and control techniques that control, reduce, or eliminate the "tilt" of a video display, and to such circuits that may be realized with LinBiCMOS circuits.

2. Relevant Background

"Tilt" is a phenomenon in color monitors in which the height of the picture on one side, generally the top and bottom edges on the right side, is less than the height of the picture on the other side. This results in the picture being displayed with a slightly trapezoidal shape, with increasing triangular black top and bottom margins. Although in many cases, the tilt is hardly noticeable, in other cases, the tilt may be sufficiently large as to be objectionable to the user.

Tilt may be caused by leakage of one or more of the transistors of the video preamplifier circuit. The video preamplifier circuit provides an output signal that defines the location that the scanning beam is to occupy on the display screen by predefining the scanning or drive voltage magnitude. However, due however to leakage across one or more DC level holding transistors, typically due to thermal effects, especially from the base of bipolar transistors, the DC voltage magnitude may not be completely maintained over the scanning time for each scan line. The result is that the display beam does not hold an exactly horizontal scan line, creating the tilt phenomenon described above.

SUMMARY OF THE INVENTION

In light of the above, therefore, it is an object of the invention to provide an improved video preamplifier circuit.

It is another object of the invention to provide a video preamplifier circuit of the type described that has reduced or eliminated "tilt" phenomenon.

It is yet another object of the invention to provide an improved method for reducing or eliminating the "tilt" of a video display of a video monitor.

It is another object of the invention to provide a video preamplifier of the type described that utilizes the benefits of MOS transistors achievable in a LinBiCMOS process to reduce or eliminate current leakages that may otherwise result in picture tilt on a video display. Since there is essentially no leakage in MOS transistors, LinBiCMOS integrated circuit processes are ideally well suited to solve the problem addressed by this invention.

These and other objects, features and advantages of the invention will be apparent to those skilled in the art from the following detailed description of the invention, when read in conjunction with the accompanying drawings and appended claims.

In accordance with a broad aspect of the invention, a circuit is presented for reducing a tilt of a video picture on a color monitor of the type in which vertical displacement of a scanning beam is controlled by a magnitude of a scan control signal. The circuit includes a circuit for providing an output signal for controlling the vertical position of the scanning beam that includes an MOS transistor having substantially zero current flow in a gate element, and connected to control the magnitude of the output signal. In a preferred embodiment, a LinBiCMOS semiconductor manufacturing process is employed to fabricate a plurality of bipolar transistors connected to provide a control voltage on the gate of the MOS transistor, which may conveniently be an NMOS device.

The bipolar transistors may be connected to form a translinear cell connected to receive a signal related to a horizontal synchronizing signal and to provide a voltage output to the gate of the MOS transistor in response thereto.

According to another broad aspect of the invention, a circuit is presented for reducing a tilt of a video picture on a color monitor of the type in which vertical displacement of a scanning beam is controlled by a magnitude of a scan control signal. The circuit includes a circuit for providing the scan control signal with substantially constant magnitude. A circuit is also provided for enabling and disabling the circuit for providing the scan control signal. The circuit for providing the scan control signal with substantially constant magnitude preferably comprises a MOS transistor, for example, an NMOS transistor.

The circuit is preferably made by a LinBiCMOS semiconductor manufacturing process, wherein the circuit for enabling and disabling the circuit for providing the scan control signal includes bipolar transistors.

According to yet another broad aspect of the invention, a circuit is provided for reducing a tilt of a video picture on a color monitor of the type in which vertical displacement of a scanning beam is controlled by a magnitude of a scan control signal, the circuit being formed by a particular process. The process includes the steps of forming a circuit for providing a scan control signal having substantially constant magnitude and forming a circuit for enabling and disabling the circuit for providing the scan control signal. The step of forming a circuit for providing a scan control signal having substantially constant magnitude preferably includes forming an MOS transistor in a semiconductor substrate, and the step of forming a circuit for enabling and disabling the circuit for providing the scan control signal preferably includes forming a bipolar circuit in the semiconductor substrate. Preferably, the steps of forming a circuit for providing a scan control signal having substantially constant magnitude comprises forming an MOS transistor in a semiconductor substrate and forming a circuit for enabling and disabling the circuit for providing the scan control signal comprises forming a bipolar circuit in the semiconductor substrate are performed as a part of a LinBiCMOS process.

According to still another broad aspect of the invention, a method is presented for reducing a tilt of a video picture on a color monitor of the type in which vertical displacement of a scanning beam is controlled by a magnitude of a scan control signal. The method includes the steps of providing the scan control signal with substantially constant magnitude and enabling and disabling the circuit for providing the scan control signal. The step of providing the scan control signal with substantially constant magnitude preferably includes constructing a circuit to provide the scan control signal using a MOS transistor, and in a preferred embodiment, an NMOS transistor, that has substantially no gate leakage current. Also, preferably, the step of enabling and disabling the circuit for providing the scan control signal includes operating bipolar transistors connected as a translinear cell to enable and disable the circuit for providing the scan control signal.

BRIEF DESCRIPTION OF THE DRAWING

The invention is illustrated in the accompanying drawing, in which.

DETAILED DESCRIPTION OF THE PREFERRED EMBODIMENTS

Figure 1:
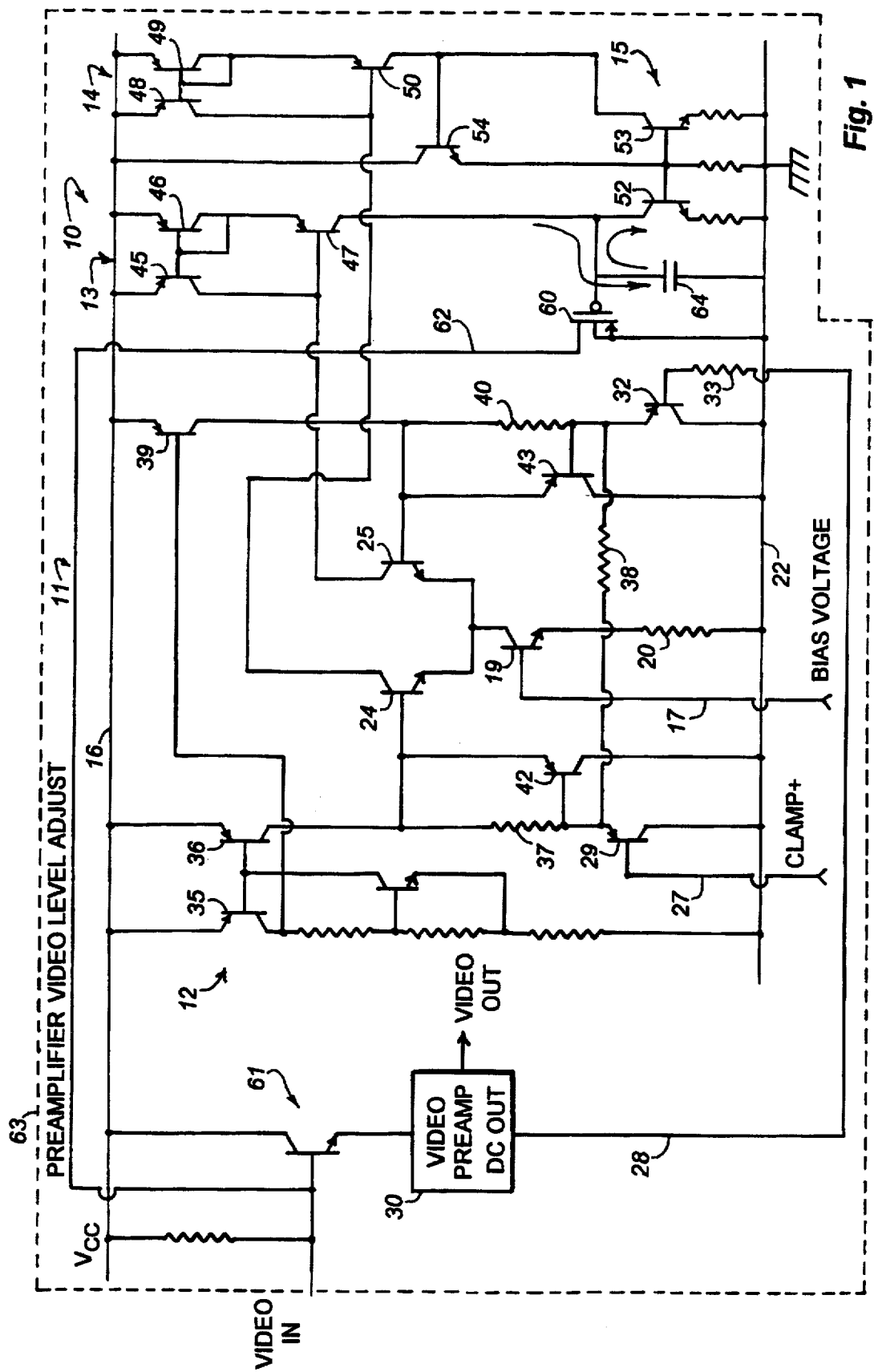
FIG. 1 is an electrical schematic diagram of a circuit for controlling a video drive signal to reduce or eliminate "tilt" of a displayed video picture on a color monitor, in accordance with a preferred embodiment the invention.

An electrical schematic diagram of a "black level hold" circuit 10 for maintaining a video picture without "tilt", in accordance with a preferred embodiment of the invention, is shown in FIG. 1. The circuit 10 comprises a translinear, or differential current mirror, cell 11, an associated active input current source 12, and output current mirrors 13, 14, and 15.

The differential current mirror cell 11 is turned on or off, or enabled and disabled, in response to a sync timing related bias voltage applied to an input line 17. The bias voltage applied to line 17 is sometimes referred to herein as a signal related to a horizontal synchronizing signal, since the bias voltage on line 17 is derived from an associated circuit in another part of the preamplifier (not shown) that indicates the period of a single horizontal sweep. Such video circuits and horizontal sweep signals are well known in the art. The bias voltage on line 17 is applied to the base of a NPN transistor 19. The NPN transistor 19, together with a resistor 20 from its collector to a ground or reference potential rail 22, form a current source that is turned on and off by the bias voltage. Thus, during the retrace period of the horizontal sweep, the output of the OSD controller or equivalent circuitry is high. This enables the black level hold circuitry 10. On the other hand, during the video period of the horizontal sweep, the voltage on line 17 is low, and the black level hold circuitry 10 is disabled.

The translinear circuit 11 has two NPN transistors 24 and 25, each controlling a respective current flow path, in response to the input DC voltage levels on the CLAMP+ line 27 and the DCOUT level on line 28. The CLAMP+ voltage is applied to the base of a PNP transistor 29 and the output DC level from the video preamplifier 30 is fed back on line 28 to the base of a corresponding PNP transistor 32 by a resistor 33. The value of the CLAMP+ voltage is normally established by the maker of the monitor (not shown) in conjunction with which the circuit 10 is to be used. The CLAMP+ level establishes the output DC level from the video preamplifier 30 to a value, generally between about 1.5 V and 2.0 V. The differential current mirror circuit 11 compares the CLAMP+ voltage with the level of the DC output, and depending upon whether the CLAMP+ voltage is larger or smaller, turns on transistor 24 or 25 to control the output current mirrors 13 or 14.

The active input current source 12 has two PNP transistors 35 and 36 to provide an input reference current through the resistor 37 and PNP transistor 29. Balancing the translinear cell 11 is a PNP transistor 39 in series with a resistor 40, matching the electrical characteristics of the PNP transistor 36 and resistor 37. Finally, two PNP transistors 42 and 43 are connected between the respective bases of NPN transistors 24 and 25 and the reference potential rail 22, with their bases connected respectively to the collectors of PNP transistors 29 and 32. The PNP transistors 42 and 43 serve to connect the bases of the NPN transistors 24 and 25 to the reference potential rail 22 when the PNP transistors 29 or 32 are conducting. A resistor 38 is connected between the emitters of the PNP transistors 29 and 32 across which the differential input voltage appears. The value of the resistance 20 used determines the gain of the translinear cell 11.

First and second output mirror circuits 13 and 14 are connected in the respective current flow paths of the NPN transistors 24 and 25 of the translinear cell 11. The mirror circuits 13 and 14 are of the so-called Wilson mirror type, the mirror circuit 13 having three PNP transistors 45, 46, and 47, and the mirror circuit 14 having three PNP transistors 48, 49, and 50. The first PNP transistor 45 of the current mirror 13 is connected directly between the $V_{cc}$ rail 16 and the current flow path of the NPN transistor 25. The second PNP transistor 46 is connected in series with the third PNP transistor 47, which has its base connected to the collector of the NPN transistor 25 of the translinear circuit 11. Thus, the current that flows in the PNP transistor 47 mirrors the current that flows through the PNP transistor 45 and the NPN transistor 25 when the circuit 10 is selected in dependence upon the state of the bias voltage appearing on line 17.

In similar fashion, the first PNP transistor 48 of the mirror circuit 14 is connected between the $V_{cc}$ rail and the current flow path of the NPN transistor 24 of the translinear circuit 11. Additionally, the second PNP transistor 49 is connected in series with the third PNP transistor 50, which has its base connected to the collector of the NPN transistor 24 of the translinear circuit 11. Thus, the current that flows in the PNP transistor 50 mirrors the current that flows through the PNP transistor 48 and the NPN transistor 24 when the circuit 10 is selected in dependence upon the state of the bias voltage appearing on line 17.

The third output mirror circuit 15 is a cross coupled collector current source type, with the current supplied to each leg via the PNP transistors 47 and 50 of the current mirrors 13 and 14. The current mirror 15 includes three NPN transistors 52, 53, and 54. The NPN transistors 52 and 53 are connected from the collectors of the PNP transistors 47 and 50, respectively, to the reference potential rail 22.

An N-channel MOS transistor 60, which may be a linear MOS device, is connected between the input stage 61 of the video preamplifier and the reference potential rail 22, with its gate connected to the collector of the mirror transistor 52. One of the advantages derived from the use of a MOS device of the type described is that such MOS device has essentially zero current leakage from its base, therefore, the charge on the capacitor 64 used to establish the control voltage on the NMOS device 60 is not discharged through undesired leakage by the video level adjust transistor. Thus, the bias on the video preamplifier circuit 30 is maintained at a constant desired level. Since the circuit includes both linear MOS devices and bipolar transistors, preferably, the circuit can be integrated onto a single semiconductor substrate, denoted by the dotted line 63, by a suitable LinBiCMOS semiconductor manufacturing process. Such LinBiCMOS processes are known in the art, and therefore are not described in detail herein.

Finally, the capacitor 64, which establishes the control voltage on the gate of the NMOS device 60, is connected between the gate of the NMOS transistor 60 and the reference potential rail 22. The capacitor 64 may be externally connected if desired, and may have a typical value, for example, of 0.1 μF. Thus, the state of conduction of the NPN transistor 52 determines whether the capacitor 64 is charged by the current through the PNP transistor 47, or is discharged through the NPN transistor 52.

Since the transistor pairs 45 and 46, and pairs 48 and 49 function as current mirror circuits, the current that flows through the current mirror circuits provided by transistors 52 and 53 mirror the currents flowing respectively through the NPN transistors 24 and 25.

When the transistor 52 conducts, the voltage on its collector drops towards the reference potential, to discharge the charge on the capacitor 64, and turn the NMOS transistor 60 off. As a result, the capacitor 64 is either charged through the PNP transistors 46 and 47, or discharged through the NPN transistor 52. Thus, the node voltage at the gate of the NMOS transistor 60 is set to determine how hard the NMOS transistor 60 should pull from the bias level at the input stage 61 to the video preamplifier 30.

It should be appreciated that since the transistor 60 is implemented by an NMOS device, instead of by a traditional bipolar device, the thermal effects that result in the "tilt" of the video picture are reduced or eliminated entirely.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A circuit for reducing a tilt of a video picture on a color monitor of the type in which a vertical displacement of a scanning beam is controlled by a magnitude of a scan control signal, comprising:
   an MOS transistor having substantially zero current leakage in a gate element, and connected to control the magnitude of the scan control signal;
   a capacitor connected to establish a control voltage on the gate of said MOS transistor; and
   a translinear cell formed of a plurality of bipolar transistors connected to provide a control voltage on said capacitor.

2. The circuit of claim 1 wherein said MOS transistor is an NMOS transistor.

3. The circuit of claim 1 wherein said bipolar transistors are connected to form a translinear circuit connected to receive a signal related to a horizontal synchronizing signal and to provide a voltage output to the gate of said MOS transistor in response thereto.

4. A circuit for reducing a tilt of a video picture on a color monitor of the type in which vertical displacement of a scanning beam is controlled by a magnitude of a scan control signal, formed by the process comprising the following steps:
   forming a MOS transistor in a semiconductor substrate for providing a scan control signal having substantially constant magnitude; and
   forming a bipolar circuit in the semiconductor substrate for controlling a charge on a capacitor connected to establish a control voltage on a gate of said MOS transistor.

5. The circuit of claim 4 wherein said steps of forming an MOS transistor in a semiconductor substrate and forming a bipolar circuit in the semiconductor substrate are performed as a part of a LinBiCMOS process.

6. A method for reducing a tilt of a video picture on a color monitor of the type in which vertical displacement of a scanning beam is controlled by a magnitude of a scan control signal, comprising the steps of:
   constructing a circuit to provide said scan control signal using a MOS transistor that has substantially no gate leakage current for providing the scan control signal with substantially constant magnitude; and
   operating bipolar transistors connected as a translinear cell to maintain a voltage on a capacitor connected to establish a control voltage on a gate of said MOS transistor.

\* \* \* \* \*